United States Patent [19]

Hayashi et al.

[11] Patent Number: 5,994,754
[45] Date of Patent: Nov. 30, 1999

[54] SEMICONDUCTOR DEVICE

[75] Inventors: Tetsuya Hayashi, Kanagawa; Yoshinori Murakami, Tokyo, both of Japan

[73] Assignee: Nissan Motor Co., Ltd., Kanagawa, Japan

[21] Appl. No.: 09/003,463

[22] Filed: Jan. 5, 1998

[30] Foreign Application Priority Data

Jan. 6, 1997 [JP] Japan ................................. 9-000106

[51] Int. Cl.$^6$ .................................................. H01L 29/70
[52] U.S. Cl. .......................... 257/495; 257/484; 257/490; 257/546; 257/605
[58] Field of Search .................................... 257/484, 546, 257/605, 490, 495

[56] References Cited

U.S. PATENT DOCUMENTS

| 4,573,066 | 2/1986 | Whight ................................... 257/495 |
| 5,028,548 | 7/1991 | Nguyen .................................. 257/605 |
| 5,841,181 | 11/1998 | Sakamoto .............................. 257/495 |

FOREIGN PATENT DOCUMENTS 1358275  7/1974  United Kingdom .................. 257/495

OTHER PUBLICATIONS

B.J. Baliga "*Modern Power Devices*" p. 99, 1983 Wiley N.Y.

*Primary Examiner*—Jerome Jackson, Jr.
*Attorney, Agent, or Firm*—McDermott, Will & Emery

[57] ABSTRACT

A multi guard ring structure for a reach-through type semiconductor device has at least first and second guard ring regions. The first guard ring region surrounds a main region with a predetermined first spacing. The second guard ring region surrounds the first guard ring region with a predetermined second spacing. To improve the ability to withstand reverse bias voltage, the second spacing between the first and second guard ring regions is made smaller than the first spacing between the main region and the first guard ring region in order that a maximum value of an electric field strength at a junction between the first guard ring region and the drift region may be equal to or lower than 85% of a maximum value of a field strength at the main junction at the avalanche breakdown condition of the main junction.

7 Claims, 3 Drawing Sheets

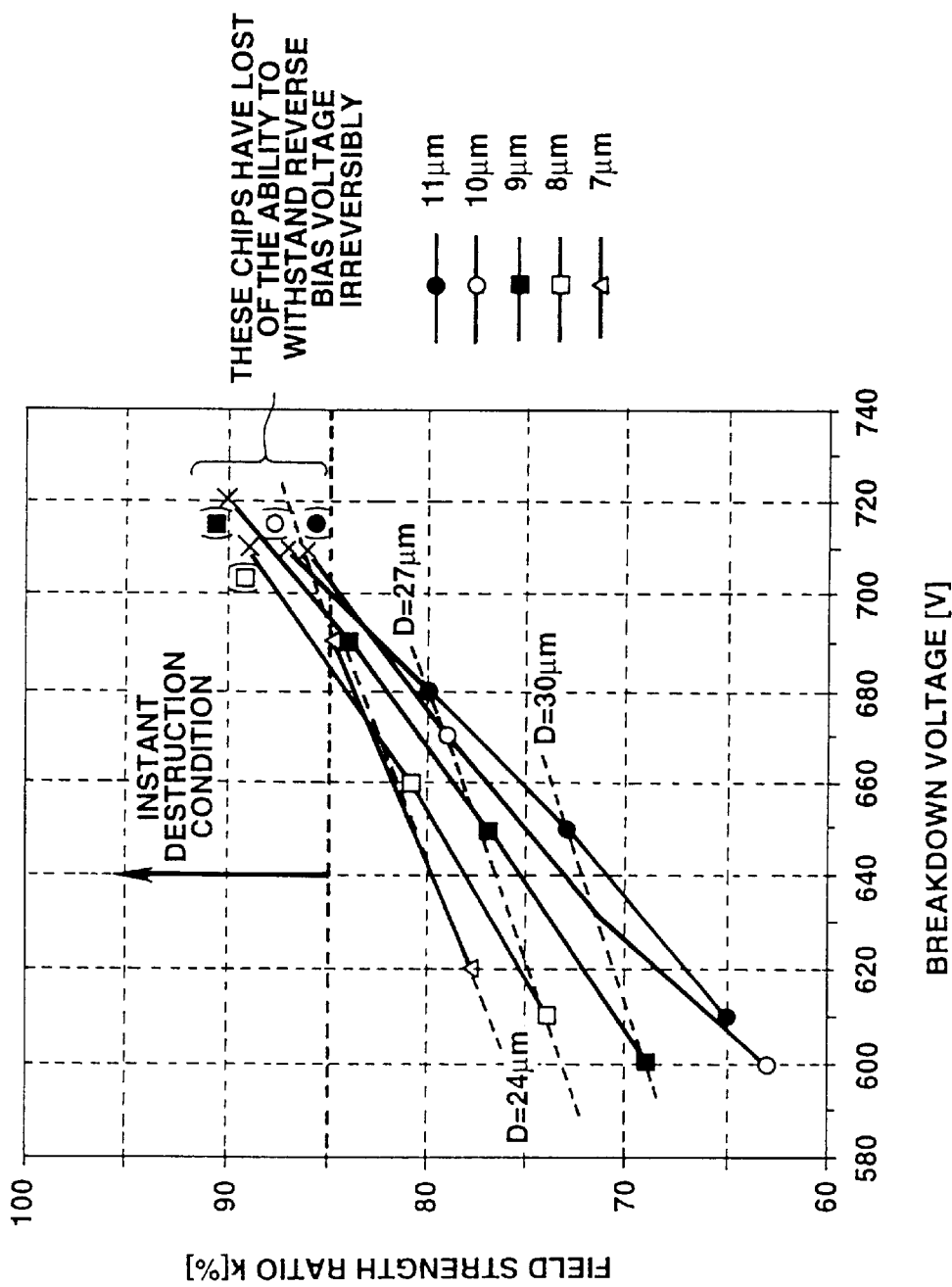

SEMICONDUCTOR DEVICE

The contents of a Japanese Patent Application No. 9(1997)-106 with a filing date of Jan. 6, 1997 in Japan, on which the content and claim for priority of the instant application are based, are hereby incorporated by reference.

BACKGROUND OF THE INVENTION

The present invention relates to a guard ring structure for a reach-through type high voltage semiconductor device.

There are two conventional guard ring structures.

A first conventional guard ring structure has equally spaced four annular guard ring regions surrounding a main region located at the center. Spacings among the main region and the guard ring regions are all equal to a predetermined value L. Four equal inter-region spacings are; a first spacing between the main region and the first nearest guard ring region, a second spacing between the first nearest guard ring region and the second nearest guard ring region, a third spacing between the second guard ring region and the third guard ring region, and a fourth spacing between the third guard ring region and the fourth guar ring region. The main and guard ring regions are p type regions formed in an n type drift layer formed on an $n^+$ type substrate layer. The main region forms a main pn junction with the drift layer. An anode electrode is connected with the main region, and a cathode electrode is connected with the substrate layer. The guard ring regions are connected with no electrodes.

The main and guard ring regions are formed by thermal diffusion from the semiconductor surface through diffusion windows. Hence, each diffused region has a cross sectional shape which is round at each corner. In the case of a reach-through type, a depletion region produced from the main junction by application of a reverse bias extends fully across the drift layer and reaches the substrate layer at a voltage level lower than a reverse bias voltage at which an avalanche breakdown occurs at the main junction. For example, the drift layer is formed to have a thickness of about 50 $\mu$m and an impurity concentration of about $1\times10^{14}/$ $cm^3$ to obtain a breakdown voltage of about 600 V.

The guard ring structure functions as follows:

The anode electrode 20 is grounded, and a positive potential is applied to the cathode electrode 21. Under these conditions, the junction between the p type main region and the n type drift region is reverse-biased, and a depletion layer extends into the drift region 5 whose impurity concentration is low to obtain a high breakdown voltage. The junction between the main region and the drift layer has a curved portion as well as a planar portion. The curved junction portion has a higher field intensity than the planer portion. Therefore, without the guard ring regions, an avalanche breakdown would occur at the curved junction portion at a reverse bias voltage lower than a breakdown voltage expected from the planar junction.

The first guard ring region near the curved main junction portion mitigates an increase of the electric field in the lateral direction when the cathode potential increases and the depletion region from the main region reaches the first guard ring region. With a further increase in the cathode potential, the depletion region starts extending from the first guard ring region. In this way, the guard ring structure acts to reduce electric field crowding, and to improve the withstand strength.

The equally spaced multi guard ring structure is easy in design, and capable of making a maximum field intensity of a surrounding guard ring region lower than a maximum field intensity of an inner region. The maximum field intensity of the first guard ring region is lower than that of the main region, and the maximum field intensity of the outer guard ring region is lower than that of the inner guar ring region. The outermost guard ring region is an exception. However, the guard ring structure is arranged to have such properties by increasing the number of guard rings or other measures.

When the spacing between the main region and the first guard ring region is reduced, the effect of mitigating the field strength at the curved main junction portion is increased, and the region at which the electric field is maximum in the main region is shifted in the curved portion toward the planar junction portion. Therefore, a reduction of the spacing between the main region and the first guard ring region improve the breakdown voltage of the main junction. However, too narrow a spacing causes a disadvantageous effect as explained later.

A second conventional multi guard ring structure is shown in B. J Baliga "MODERN POWER DEVICES", John Wiley & Sons. Inc., page 99, FIG. 3.26. In a p type drift layer, there are formed an $n^+$ type main junction region, an $n^+$ type first guard (or field) ring region surrounding the main junction region with a first spacing from the main junction region, an $n^+$ type second guard ring region surrounding the first guard ring region with a second spacing from the first guard ring region, and an $n^+$ type third guard ring region surrounding the second guard ring region with a third spacing from the second guard ring region. In this structure, the guard ring spacing together with the guard ring width is decreased with an increase in the distance from the main junction region. This structure causes a depletion region to extend gradually from an end portion of the main junction region in the lateral direction. The guard ring width is decreased in the lateral direction away from the main junction region so that an outer guard ring is narrower than an inner guard ring. Therefore, the depletion layer depth is gradually decreased along the lateral direction away from the main junction region, underneath the gradually narrowed guard ring regions. This design can save space at the device periphery. As explained in this document, the guard ring regions share the applied voltage equally in the ideal case, and avalanche breakdown is produced at the outer edges of all the guard ring regions simultaneously. However, this structure is a non-reach-through structure in which a depletion layer from the main junction region does not reach the bottom of the p type drift layer.

SUMMARY OF THE INVENTION

It is an object of the present invention to provide a guard ring structure having a higher withstanding strength.

According to the present invention, a semiconductor device comprises a highly doped substrate layer of a first conductivity type (such as the n type), a drift layer of the first conductivity type formed on the highly doped substrate layer, a main junction region of a second conductivity type (such as the p type) formed in the drift layer from an upper surface of the drift layer to form a main pn junction between the main junction region and the drift layer, and at least first and second annular guard ring regions of the second conductivity type formed in the drift layer from the upper surface. The first guard ring region surrounds the main region with a predetermined first spacing between the main region and the first guard ring region. The second guard ring region surrounds the first guard ring region with a predetermined second spacing between the first guard ring region and the second guard ring region. The drift region has an impurity concentration and a depth which are tailored to cause a depletion region to extend from the main junction into the drift region by application of a reverse bias to the main junction, and to reach the substrate layer at a first reverse voltage lower than a second reverse bias voltage at which an avalanche breakdown occurs at the main junction.

Moreover, at the second reverse bias voltage, a depletion layer extends in the drift layer vertically from the first guard ring region to the substrate layer under the first guard ring region and from the second guard ring region to the substrate layer under the second guard ring region.

The second spacing between the first guard ring region and the second guard ring region is made smaller than the first spacing between the main region and the first guard ring region so that, under the avalanche breakdown condition of the main junction, a maximum value of an electric field strength at a junction between the first guard ring region and the drift layer is equal to or lower than 85% of a maximum value of a field strength at the main junction.

This arrangement of the first and second guard ring regions can lower the field strength at the junction of the first guard ring region, and prevent the first guard ring region from breaking down, thereby improving the withstand strength.

By contrast, the equally spaced conventional multi guard ring structure is limited in improvement of the withstand strength.

When the spacing between the main region and the first guard ring region is reduced in the conventional equally spaced multi guard ring structure, the effect of mitigating the field strength at the curved main junction portion is increased, and the region at which the electric field is maximum in the main region is shifted in the curved portion toward the planar junction portion. Therefore, a reduction of the spacing between the main region and the first guard ring region improves the breakdown voltage of the main junction. However, it is confirmed by experiment that too narrow a spacing causes simultaneous occurrence of loss of a withstanding strength and an avalanche breakdown.

In the equally spaced conventional multi guard ring structure, a decrease of the guard ring spacing makes the maximum field strength at the first guard ring region closer to the maximum field strength at the main region. Therefore, an avalanche breakdown occurs at the neighboring guard ring region simultaneously with an avalanche breakdown at the main region. In this case, while a current flowing into the p type guard region moves through the n type drift layer to the grounded p type main region, presumably the current concentrates locally and a part of the main junction breaks down.

Therefore, the equally spaced multi guard structure is limited in improvement of the withstand strength.

The present invention by contrast can ensure higher breakdown voltages with the unequally spaced multi guard ring structure. When, for example, a drift layer of a very low impurity concentration is used in a peripheral withstanding structure of a high breakdown voltage bipolar transistor, the unequally spaced arrangement of the present invention can further improve the breakdown voltage. Alternatively, the present invention makes it possible to reduce the on resistance of a bipolar transistor by further reducing the thickness of the drift layer while maintaining a required withstand strength. The present invention enables a further reduction in the spacing between the main region and the first guard ring region, and thereby reduces the required area of the withstanding structure.

BRIEF DESCRIPTION OF THE DRAWINGS

FIG. 3 is a graph showing a relationship between the breakdown voltage and the field strength ratio of the first guard ring region at the breakdown voltage, for showing findings of the present invention.

DETAILED DESCRIPTION OF THE INVENTION

Figure 1:
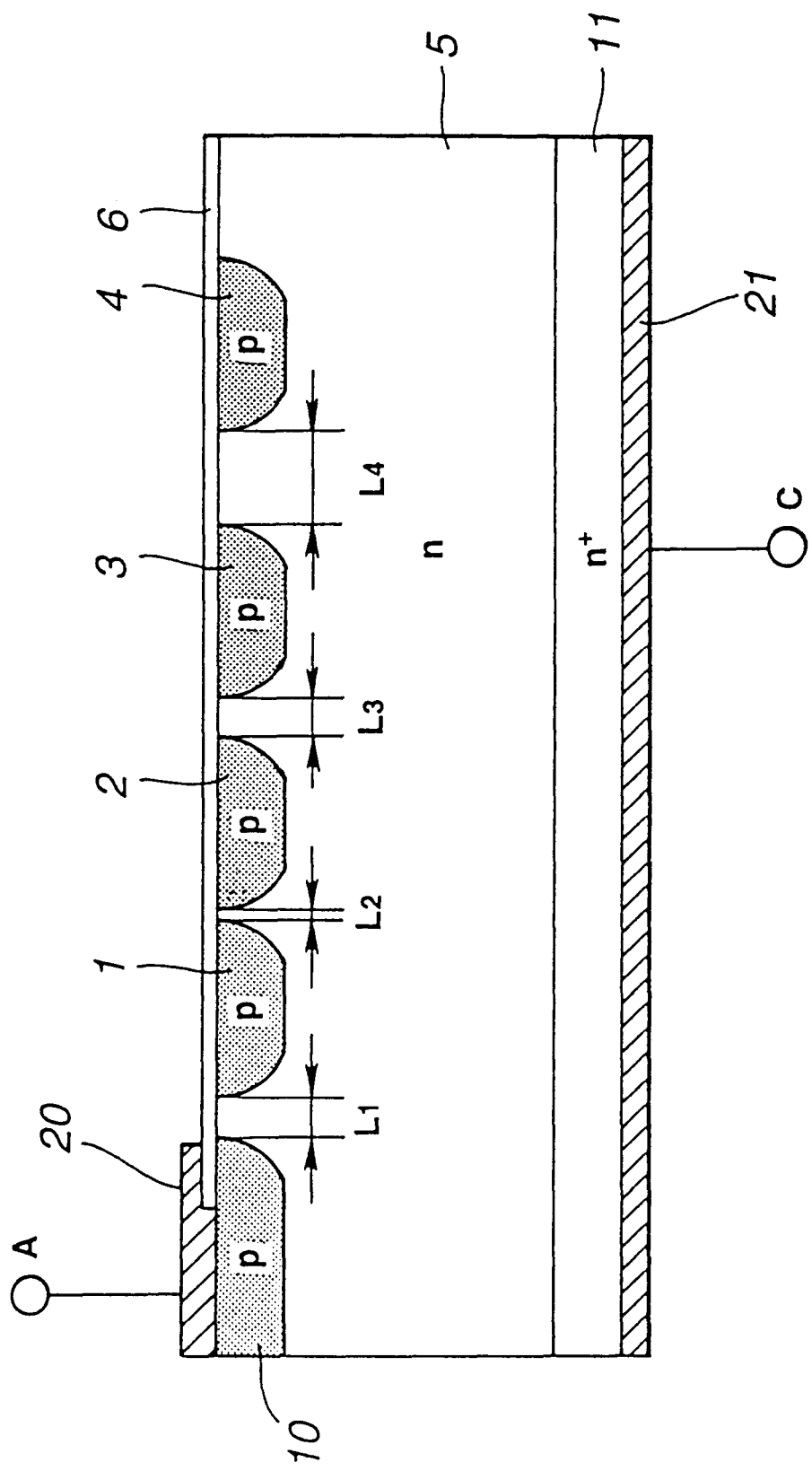
FIG. 1 is a sectional view showing a guard ring structure for a reach-through semiconductor device according to one embodiment of the present invention.

FIG. 1 shows a semiconductor device according to one embodiment of the present invention. In this example, the semiconductor material of the device is silicon.

The semiconductor device shown in FIG. 1 comprises an $n^+$ type substrate layer or region 11, an n type drift layer or region 5 and a p type main junction region 10.

An anode electrode 20 is connected with the main region 10, and a cathode electrode 21 is connected with the substrate layer 11.

The semiconductor device of FIG. 1 further comprises a plurality of p type guard ring regions. In this example, there are four of the p type guard ring regions 1~4. The four p type guard ring regions 1~4 are annular and formed around the main region 10. FIG. 1 shows only the right half of the sectional structure. The left half is omitted merely for simplification. On the left side of the main region, the guard rings 1~4 are formed in the manner of bilateral symmetry. Each guard ring region surrounds the main region 10. Each guard ring region is not connected with any of the electrodes.

An insulating film 6 extends on the main region 10, the guard ring regions 1~4 and the drift layer 5. The insulating film 6 has a hole through which the anode electrode 20 is connected with the main region 10. The surface of the drift region 5 is covered with the insulating film 6. Each of the guard ring regions 1~4 is under the insulating film 6.

The cross-sectional shapes of the main region 10 and the guard ring regions 1~4 have rounded ends as shown in FIG. 1. These regions are formed by diffusion of p type impurity atoms from certain diffusion windows for these respective regions on the surface of the device.

The first guard ring region 1 is an innermost ring surrounding the main region 10. In this example, the fourth guard ring region 4 is outermost. The second guard ring region 2 is formed between the first guard ring region 1 and third guard ring region 3. A first spacing L1 shown in FIG. 1 is a distance between the main region 10 and the first guard ring region 1. A second spacing L2 is a distance between the first guard ring region 1 and the second guard ring region 2. A third spacing L3 is a distance between the second guard ring region 2 and the third guard ring region 3. A fourth spacing L4 is a distance between the third guard ring region 3 and the fourth guard ring region 4.

The present invention requires at least two guard ring regions. The number of guard ring regions is determined in accordance with the required breakdown voltage and other factors.

The guard ring structure according to this embodiment is such a reach through structure that the depletion layer caused in the drift region 5 from the main region 10 by applying a reverse bias voltage between the p type main region 10 and the n type drift region 5 reaches the substrate 11 before the applied reverse bias voltage rises up to the avalanche breakdown voltage of the main junction. For example, to obtain an ability to withstand 600 V of reverse bias voltage, the structure may have the drift region 5 of about 50 $\mu$m thick, and $1\times10^{14}/cm^3$ of its impurity concentration. The main region 10 and the guard ring regions 1–4 of this example are fabricated by boron ion implantation of about $5\times10^{15}/cm^2$ dose in predetermined surface regions, and thermal diffusion to obtain a junction depth of about 10 $\mu$m. The depths of the regions 10 and 1~4 are substantially identical to one another. In this example, the width of the diffusion window of each guard ring region is about equal to the junction depth. At the above-mentioned structural conditions of the main region 10 and the drift region 5, a breakdown voltage obtained by numerical calculation in the case of a planar pn junction is about 837 V.

The semiconductor device of FIG. 1 functions as follows:

The anode electrode 20 is grounded, and a positive potential is applied to the cathode electrode 21. Under these conditions, the junction between the p type main region 10 and the n type drift region 5 is reverse-biased, and a depletion layer extends into the drift region 5 whose impurity concentration is low to obtain a high voltage. The electric field strength at the junction between the main region 10 and the drift region 5 increases, with increasing the width of the depletion layer. The point on the junction that the value of the electric field is the strongest exists in the edge portion of the main region 10. Avalanche breakdown occurs with the predetermined strength of electric field. So that this point of junction can lose the ability to withstand reverse bias voltage at the lower voltage than the breakdown voltage at the point of the flat portion of the junction. When the depletion region reaches the p type first guard ring region 1 being adjacent to the main region 10 with increasing reverse bias voltage, increasing rate of the electric field of the main junction in the lateral direction is modified, and ability to withstand reverse bias voltage at the edge portion of the main region 10 improves.

As the spacing L1 between the main region 10 and the first guard ring region 1 is reduced, the electric field strength at the curved portion of the main junction of the main region 10 is lowered. Therefore, the portion that the value of electric field is the strongest shifts toward the deep and flat portion of the main junction, when the spacing L1 between the main region 10 and the first guard ring region 1 narrows. Therefore, the reduction of the spacing L1 improves the ability to withstand reverse bias voltage, of the junction between the main region 10 and the drift region 5. However, in the structure in which the spacing L2 between the first guard ring region 1 and the second guard ring region 2 is set equal to the first spacing L1, an avalanche breakdown occurs at the guard ring region simultaneously with an avalanche breakdown at the main junction. Therefore, as the avalanche current flowing into the p-type first guard ring region 1 flows out to the p-type main region 10 through a part of the n-type drift region 5, the main junction loses the ability to withstand reverse bias voltage by similar mechanism to the secondary breakdown phenomenon of bipolar transistors.

The present invention is based on the following conclusion that the inventors of the present invention has obtained by experimentation and numerical computation. An avalanche breakdown does not occur at the first guard ring region 1 when a field strength ratio k [k=(E1/E0)×100%] is equal to or lower than 85%. This ratio k is a ratio of the maximum field strength E1 at the junction of the first guard ring region 1 to the maximum field strength E0 at the main junction of the main region 10 when avalanche breakdown will occur at the main junction of the main region 10.

The experiment was first carried out to examine a relationship of a breakdown voltage with respect to a spacing between the main region 10 and the first guard ring 1 or the spacing between the guard rings being adjacent to each other, by using the conventional design of the equally spaced multi-guard ring structure. Conditions of fabricated experimental samples are as follows: To achieve a breakdown voltage of about 600 V, the thickness of the drift layer 5 is about 50 $\mu$m, and the impurity concentration of the drift layer 5 is about $1\times10^{14}/cm^3$. In this experiment, the junction depth Xj of the main region 10 and the guard ring regions is about 10 $\mu$m. The width of the guard ring regions is about 10 $\mu$m. The width of the diffusion window of the guard ring regions is substantially equal to the depth of the guard ring regions.

Under the above-mentioned structural conditions of the main region 10 and the drift region 5, a breakdown voltage obtained by numerical calculation is about 837 V in the case of a planar pn junction. In this example, there are provided a sufficient number of guard ring regions to make the field strength of the outermost guard ring region lower than the field strength of the inner guard ring. Furthermore, numerical calculation was carried out to determine the field strength ratio k at the first guard ring region 1 on the occasion of an avalanche breakdown under the above-mentioned structural conditions.

Figure 2:
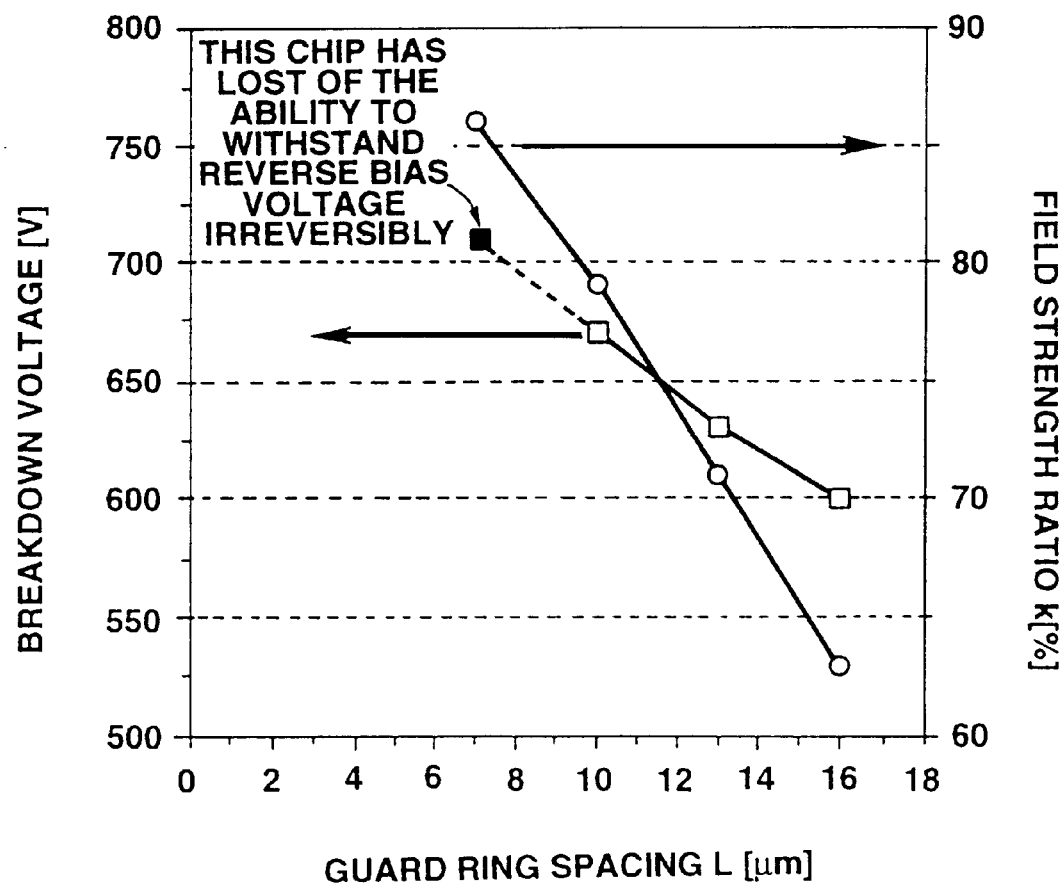
FIG. 2 is a graph showing relationships between a spacing among a main region and guard ring regions, and each of a breakdown voltage and an electric field strength ratio at the first guard ring region at the breakdown voltage, for showing findings of the present invention.

FIG. 2 shows the breakdown voltage and the field strength ratio k at the first guard ring region 1 with respect to the spacing L between the main region 10 and the first guard ring 1 or the spacing between the guard rings being adjacent to each other under the above-mentioned structure conditions. The horizontal axis represents the spacing L between two adjacent regions of the main region 10 and the guard ring regions. The spacing L is zero when two adjacent regions are in contact with each other. The left side vertical axis represents the breakdown voltage. The right side vertical axis represents the field strength ratio k which is a ratio of the maximum field strength at the junction of the first guard ring region 1 to the maximum field strength at the main junction of the main region 10 under the breakdown condition.

As shown in FIG. 2, the breakdown voltage increases almost linearly as the spacing L is decreased. At a spacing of L=7 $\mu$m, however, the withstanding ability is instantly lost simultaneously with an avalanche breakdown at an applied voltage of 710 V.

The field strength ratio k expressed along the right side vertical axis increases as the spacing L is decreased. The field strength ratio k is 86% at the spacing of L=7 $\mu$m at which the instant loss of the withstanding ability is caused simultaneously with the avalanche breakdown.

FIG. 3 shows various forms of a relationship between the breakdown voltage and the field strength ratio k of the first guard ring region 1, obtained by changing the junction depth Xj of the main region 10 and the guard ring regions. The horizontal axis of FIG. 3 represents the breakdown voltage. The field strength ratio k shown along the vertical axis is the ratio of the maximum field strength E1 at the junction of the first guard ring region 1 to the maximum field strength E0 at the main junction of the main region 10 at the breakdown condition. In FIG. 3, "D"s are the spacing between the diffusion windows of the main region 10 and of the first guard ring 1, or the spacing between the diffusion windows of guard rings being adjacent to each other. Because of the lateral diffusion effect, each of the inter-region spacings L1~L4 is smaller than a corresponding inter-window spacing D by twice the distance in the lateral direction from the window edge to the junction. As to the junction depth of the main region 10 and the guard ring regions, the range of 7~11 $\mu$m is divided into intervals of 1 $\mu$m.

When, for example, the junction depth Xj is equal to 11 $\mu$m, the ability to withstand reverse bias voltage loses instantly at an inter-window spacing D of 24 $\mu$m and a breakdown voltage of 710 V. In this case, the field strength ratio k is equal to 87%. In the case of Xj=7 $\mu$m, the breakdown voltage is 690 V at an inter-window spacing D of 21 $\mu$m. At this condition, no instant loss of the withstanding ability occurs, and the field strength ratio k is 85%. Thus, it is found out that, even if the junction depth Xj is changed, there exist a certain condition under which the withstanding ability is lost instantly with an avalanche breakdown, and the condition is that the field strength ratio k of the first guard ring region 1 is higher than 85%, independently of the junction depth.

In this embodiment of the present invention, therefore, the structure is so designed as to allow a further decrease of the first spacing L1 between the main region 10 and the first guard ring region 1, and yet prevent breakdown at the first guard ring region 1, thereby improving the breakdown voltage. In this structure, the first spacing L1 between the main region 10 and the first nearest guard ring region 1 is made greater than the second spacing L2 (L2≠0) between the first guard ring region 1 and the second guard ring region 2 (L1>L2) to make the field strength ratio k of the maximum field strength at the first guard ring region 1 to the maximum field strength at the main region 10 equal to or lower than 85%.

The structure according to the embodiment of the present invention is a reach-through structure designed to allow a depletion layer to reach the junction between the drift layer 5 and the substrate layer 11 at a reverse bias level much lower than the avalanche breakdown condition. In such a structure, the maximum field strength E0 of the main region 10 at the avalanche breakdown condition is a function of the potential difference between the main region 10 and the substrate layer 11, and the spacing L1 between the main region 10 and the first guard ring region 1. The maximum field strength E1 of the first guard ring region 1 at the avalanche breakdown condition is a function of the potential difference between the first guard ring region 1 and the substrate layer 11, and the spacing L2 between the first guard ring region 1 and the second guard ring region 2. The field strength ratio at the first guard ring region 1 is set equal to or lower than 85% by setting the second spacing L2 between the first and second guard ring regions 1 and 2 equal to a predetermined nonzero (positive) small value, and performing numerical calculation within a range in which the first spacing L1 between the main region 10 and the first guard ring region 1 is greater than the second spacing L2. The spacing for each of the third and fourth guard ring regions 3 and 4 (and one or more further outer guard ring regions, if any) is so determined that the maximum field strength at each guard ring region is equal to or lower than the maximum filed strength at the first guard ring region 1.

The thus-constructed structure can safely withstand higher voltages which the equally spaced conventional guard ring structure could not withstand due to simultaneous avalanche breakdown of the main region 10 and the first guard ring region 1.

The present invention makes it possible to reduce the resistance of the drift layer 5 because the depth of the drift layer 5 can be decreased without lowering the breakdown voltage.

The before-mentioned second conventional guard ring structure is seemingly similar to the structure according to the present invention. However, the structure of the present invention is fundamentally different from the conventional structure.

First, the second conventional guard ring structure is not a reach-through structure. In the conventional structure, a depletion layer does not reach the bottom of the drift layer even at reverse bias conditions near the avalanche breakdown condition. In the structure of FIG. 1, by contrast, the depletion layer reaches the substrate layer 11 at a lower reverse bias level, and thereafter extends outwards so as to ease the field strength of the outer guard ring regions. The situation of the electric field around the main junction region 10 and the guard ring regions is remarkably different between both structures. The precondition is utterly different between the invention and the second conventional technique.

As explained in the before-mentioned document of Baliga, the guard ring spacing is decreased along the outward direction away from the main junction region to distribute the potential evenly over the guard ring regions and to produce avalanche breakdown at all the guard ring regions simultaneously. By contrast to this, the objective of the spatial relation of L1>L2 is not to attain uniform potential distribution. This spatial relation is intended to produce an avalanche breakdown only at the main junction region 10, and this spatial relation is limited to the relation between the first and second spacings. The third spacing L3 between the second guard ring region 2 and the third guard ring region 3 can be made equal to the second spacing L2 between the first guard ring region 1 and the second guard ring region 2. In the outer zone outside the second guard ring, the guard ring spacing can be increased so that an outer guard ring spacing is greater than an inner guard ring spacing, so as to make the maximum field strength of the third or subsequent guard ring approximately equal to the maximum field strength at the first guard ring region.

According to the illustrated embodiment of the present invention, the second spacing L2 is the smallest among all the guard ring spacings. Each of the main region and the guard ring regions may be in the form of a square with rounded corners in the upper semiconductor surface, and the main region and the guard ring regions may form a radially symmetric pattern of squares of different sizes having sides parallel to either of two straight lines crossing at right angles. Each of the main region and the guard ring regions may be in the form of a rectangle instead of being square. Alternatively, the main region and the guard ring regions may be circular, and form a pattern of concentric circles in the upper semiconductor surface.

What is claimed is:

1. A semiconductor device comprising:
   a highly doped substrate layer of a first conductivity type;
   a drift layer of the first conductivity type formed on the highly doped substrate layer, the drift layer having a first main surface contacted with the substrate layer and a second main surface opposite to the first main surface;
   a main region of a second conductivity type formed in the second main surface of the drift layer;
   a first annular guard ring region of the second conductivity type which is formed in the second main surface of the drift layer and which surrounds the main region with a predetermined first spacing from the main region; and a second annular guard ring region of the second conductivity type which is formed in the second main surface of the drift layer and which surrounds the first guard ring region with a predetermined second spacing from the first guard ring region;

wherein the drift layer has an impurity concentration and a depth which are, respectively, in such predetermined ranges that a depletion region extending into the drift layer by application of a reverse bias to a main junction formed between the main region and the drift layer reaches the substrate layer before occurrence of an avalanche breakdown at the main junction;

wherein, when a reverse bias is applied to the main junction to an avalanche breakdown condition, the drift layer is depleted in a region extending from the second main surface of the drift layer to a junction between the drift layer and the substrate layer under the first and second guard ring regions; and wherein the second spacing between the first guard ring region and the second guard ring region is smaller than the first spacing between the main region and the first guard ring region so that, at the avalanche breakdown condition of the main junction, a maximum value of an electric field strength at a junction between the first guard ring region and the drift layer is equal to or lower than 85% of a maximum value of a field strength at the main junction.

2. A semiconductor device as claimed in claim 1 wherein the semiconductor device further comprises a third annular guard ring region of the second conductivity type surrounding the second guard ring region, and a third spacing between the second guard ring region and the third guard ring region is equal to or greater than the second spacing between the first guard ring region and the second guard ring region.

3. A semiconductor device as claimed in claim 2 wherein the semiconductor device further comprises a fourth annular guard ring region of the second conductivity type surrounding the third guard ring region, and a fourth spacing between the third guard ring region and the fourth guard ring region is equal to or greater than the second spacing between the first guard ring region and the second guard ring region.

4. A reach-through semiconductor device comprising:

a highly doped substrate layer of a first conductivity type;

a lightly doped drift layer of the first conductivity type formed on the highly doped substrate layer;

a main junction region of a second conductivity type extending from an upper surface of the drift layer into the drift layer toward the substrate layer;

an electrode pair for applying a reverse bias voltage to a main pn junction formed between the main junction region of the second conductivity type and the drift layer of the first conductivity type, the electrode pair including a topside electrode connected with the main junction region, and a bottom electrode connected with the substrate layer;

a plurality of annular guard ring regions of the second conductivity type each extending into the drift layer from the upper surface of the drift layer and surrounding the main region, the main region and the guard ring regions being separated by the drift layer from one another, the guard ring regions defining a plurality of guard ring spacings each of which is a distance between adjacent two of the main and guard ring regions, the plurality of the guard ring regions comprising first and second annular guard ring regions and the plurality of the guard ring spacings comprising first and second spacings, the first guard ring region surrounding the main region and being separated by the drift layer from the main region with the first spacing defined between the main region and the first guard ring region, the second guard ring region surrounding the first guard ring region and being separated by the drift layer from the first guard ring region with the second spacing defined between the first guard ring region and the second guard ring region, the second spacing being smaller than the first spacing and the second spacing being equal to or smaller than any other one of the guard ring spacings;

wherein the plurality of the guard ring regions comprises a third guard ring region surrounding the second guard ring region and defining a third spacing which is a distance between the second guard ring region and the third guard ring region, the third spacing is equal to or greater than the second spacing.

5. A reach-through semiconductor device as claimed in claim 4, wherein the semiconductor device is of a reach-through type and the drift layer has a depth and a impurity concentration which are chosen to make a reach-through voltage lower than an avalanche breakdown voltage, the reach-through voltage being a reverse bias voltage at which a depletion region extending from the main junction into the drift layer reaches the substrate layer, the avalanche breakdown voltage being a reverse bias voltage at which an avalanche breakdown occurs at the main junction.

6. A reach-through semiconductor device comprising:

a highly doped substrate layer of a first conductivity type;

a lightly doped drift layer of the first conductivity type formed on the highly doped substrate layer;

a main junction region of a second conductivity type extending from an upper surface of the drift layer into the drift layer toward the substrate layer;

an electrode pair for applying a reverse bias voltage to a main pn junction formed between the main junction region of the second conductivity type and the drift layer of the first conductivity type, the electrode pair including a topside electrode connected with the main junction region, and a bottom electrode connected with the substrate layer;

a plurality of annular guard ring regions of the second conductivity type each extending into the drift layer from the upper surface of the drift layer and surrounding the main region, the main region and the guard ring regions being separated by the drift layer from one another, the guard ring regions defining a plurality of guard ring spacings each of which is a distance between adjacent two of the main and guard ring regions, the plurality of the guard ring regions comprising first and second annular guard ring regions and the plurality of the guard ring spacings comprising first and second spacings, the first guard ring region surrounding the main region and being separated by the drift layer from the main region with the first spacing defined between the main region and the first guard ring region, the second guard ring region surrounding the first guard ring region and being separated by the drift layer from the first guard ring region with the second spacing defined between the first guard ring region and the second guard ring region, the second spacing being smaller than the first spacing and the second spacing being equal to or smaller than any other one of the guard ring spacings;

wherein the first and second guard ring regions are so arranged that, at an avalanche breakdown voltage at which an avalanche breakdown occurs at the main junction, a maximum electric field strength at a junction between the first guard ring region and the drift layer is equal to or lower than 85% of a maximum field strength at the main junction.

7. A reach-through semiconductor device comprising:

a highly doped substrate layer of a first conductivity type;

a lightly doped drift layer of the first conductivity type formed on the highly doped substrate layer;

a main junction region of a second conductivity type extending from an upper surface of the drift layer into the drift layer toward the substrate layer;

an electrode pair for applying a reverse bias voltage to a main pn junction formed between the main junction region of the second conductivity type and the drift layer of the first conductivity type, the electrode pair including a topside electrode connected with the main junction region, and a bottom electrode connected with the substrate layer;

a plurality of annular guard ring regions of the second conductivity type each extending into the drift layer from the upper surface of the drift layer and surrounding the main region, the main region and the guard ring regions being separated by the drift layer from one another, the guard ring regions defining a plurality of guard ring spacings each of which is a distance between adjacent two of the main and guard ring regions, the plurality of the guard ring regions comprising first and second annular guard ring regions and the plurality of the guard ring spacings comprising first and second spacings, the first guard ring region surrounding the main region and being separated by the drift layer from the main region with the first spacing defined between the main region and the first guard ring region, the second guard ring region surrounding the first guard ring region and being separated by the drift layer from the first guard ring region with the second spacing defined between the first guard ring region and the second guard ring region, the second spacing being smaller than the first spacing and the second spacing being equal to or smaller than any other one of the guard ring spacings;

wherein the plurality of the guard ring spacing comprises an outer spacing which is greater than the second spacing.

* * * * *